United States Patent
Nagamoto et al.

(10) Patent No.: US 7,438,631 B2
(45) Date of Patent: Oct. 21, 2008

(54) SURFACE-PROTECTING SHEET AND SEMICONDUCTOR WAFER LAPPING METHOD

(75) Inventors: Koichi Nagamoto, Saitama (JP); Hitoshi Ohashi, Saitama (JP); Kazuhiro Takahashi, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/575,510

(22) PCT Filed: Oct. 14, 2004

(86) PCT No.: PCT/JP2004/015131

§ 371 (c)(1), (2), (4) Date: Apr. 13, 2006

(87) PCT Pub. No.: WO2005/038894

PCT Pub. Date: Apr. 28, 2005

(65) Prior Publication Data
US 2007/0066184 A1    Mar. 22, 2007

(30) Foreign Application Priority Data
Oct. 16, 2003   (JP)   ............ 2003-356280

(51) Int. Cl.
*B24B 1/00* (2006.01)
(52) U.S. Cl. .............. 451/59; 451/54; 451/526
(58) Field of Classification Search ............ 451/41, 451/54, 59, 63, 526–539; 438/692, 693; 156/345.11, 345.12
See application file for complete search history.

(56) References Cited

U.S. PATENT DOCUMENTS

| | | | |
|---|---|---|---|
| 6,462,415 B1 | 10/2002 | Ishiguri et al. | |
| 6,666,752 B1 | 12/2003 | Yamamoto et al. | |
| 6,688,948 B2 * | 2/2004 | Lo | 451/41 |
| 6,702,652 B2 | 3/2004 | Arai | |
| 6,869,830 B2 * | 3/2005 | Nanjo | 438/113 |
| 6,930,023 B2 | 8/2005 | Okada et al. | |
| 7,037,758 B2 * | 5/2006 | Karasawa et al. | 438/113 |
| 7,059,942 B2 * | 6/2006 | Strasbaugh et al. | 451/41 |
| 7,135,124 B2 * | 11/2006 | Krywanczyk et al. | 216/88 |

FOREIGN PATENT DOCUMENTS

EP    1 298 713 A1    4/2003

(Continued)

*Primary Examiner*—Dung Van Nguyen
(74) *Attorney, Agent, or Firm*—The Webb Law Firm, P.C.

(57) ABSTRACT

It is an object of the present invention to provide a surface protective sheet and a method for grinding a semiconductor wafer, by the use of which any dimple is not formed, nor occurs breakage and fouling of a wafer even when a wafer having high bumps which are highly densely arranged is ground to an extremely small thickness, and besides, no adhesive is left at the roots of the bumps after the surface protective sheet is peeled. The surface protective sheet of the invention is used for grinding a back surface of a semiconductor wafer, and in the surface protective sheet, one surface of a base sheet is provided with an opening portion having a diameter smaller than an outer diameter of a semiconductor wafer to be stuck, on said opening portion no adhesive layer being formed, and a portion which is provided around the opening portion and on which an adhesive layer is formed.

9 Claims, 2 Drawing Sheets

FOREIGN PATENT DOCUMENTS

| | | |
|---|---|---|
| JP | 2-028924 A | 1/1990 |
| JP | 5-062950 A | 3/1993 |
| JP | 2003-051473 A | 2/2003 |
| JP | 2004-288725 A | 10/2004 |
| WO | WO 00/12643 A1 | 3/2000 |

* cited by examiner

SURFACE-PROTECTING SHEET AND SEMICONDUCTOR WAFER LAPPING METHOD

TECHNICAL FIELD

The present invention relates to a surface protective sheet and a method for grinding a semiconductor wafer. More particularly, the present invention relates to a surface protective sheet preferably used for grinding a back surface of a semiconductor wafer, on a circuit surface thereof high bumps are arranged in a high density, and a method for grinding a semiconductor wafer provided with such bumps.

BACKGROUND ART

As high-density mounting of semiconductor devices is promoted, bumps made of solder or the like have been heretofore used for connecting semiconductor chips to substrates, and in order to directly connect them, bumps in the form of balls each having a diameter of about 100 μm have been used frequently. If a back surface of a wafer provided with such high bumps on a circuit surface thereof is ground, a difference in pressure due to a difference in bump height exerts influence on the back surface directly, and this influence cannot be absorbed by the cushioning effect of an adhesive sheet that is provided for surface protection. As a result, the wafer is broken during the grinding process, or a dimple (concave produced on the back surface) is formed to deteriorate reliability of the completed device. In order to avoid such problems in the conventional technique, the finished thickness is made relatively large so that breakage of wafer should not occur or designing is made so that bumps should be arranged in a low density.

In recent years, however, arrangement of high bumps in a high density has been required for many devices. If a usual adhesive sheet "A" for surface protection is used for such devices, the adhesive layer cannot be stuck to the edge of the wafer because of an obstacle of the bump, as shown in FIG. 4. As a result, a part of cleaning water that is sprayed for the purpose of removing heat or grinding dust generated during the back surface grinding process sometimes penetrates to the circuit surface side, thereby fouling the circuit surface.

To cope with the above problem, the thickness of the adhesive layer is increased and the fluidity of the adhesive is increased to bring the adhesive layer and the edge of the wafer into close contact with each other. However, because the adhesive is liable to come round onto the root portions of the bumps, the adhesive having adhered to the root portions of the bumps undergoes layer internal rupture by the peeling operation of the adhesive sheet, and a part of the adhesive is left. This problem may occur also in the case where an adhesive sheet using an energy ray-curable type adhesive is used. If the adhesive left on the circuit surface is not removed by solvent cleaning or the like, it remains as a foreign substance in the completed device and impairs reliability of the device.

Japanese Patent Laid-Open Publication No. 62950/1993 ("JP '950"), there is disclosed a method for sticking a protective tape to a semiconductor wafer, wherein a protective tape capable of controlling adhesive strength by proper treatment is used and the protective tape is stuck only to the peripheral region of a semiconductor wafer with a strong adhesive strength. To be brief, in this method, an ultraviolet ray-curable type adhesive tape is used as the protective film, and prior to sticking of the tape to the semiconductor wafer, the adhesive layer which is to be brought into contact with the circuit-formed region of the wafer is cured, and fixing of the wafer is carried out only in the peripheral region of the wafer.

In the method of the aforementioned JP '950, however, the cured adhesive layer and the uncured adhesive layer are present on the same plane. Therefore, if the height of the bump is increased, the adhesive layer cannot be stuck to the edge of the wafer because of an obstacle of the bump. On this account, such a defect that the cleaning water penetrates to the circuit surface side as shown in FIG. 4 has not been improved sufficiently.

The present invention has been made in view of such prior technique as mentioned above, and it is an object of the present invention to provide a surface protective sheet and a method for grinding a semiconductor wafer, by the use of which any dimple is not formed, nor occurs breakage and fouling of a wafer, even when a wafer having high bumps which are highly densely arranged is ground to an extremely small thickness, and besides, no adhesive is left at the roots of the bumps after the surface protective sheet is peeled.

SUMMARY OF THE INVENTION

The surface protective sheet according to the present invention is used for grinding a back surface of a semiconductor wafer, wherein:

one surface of a base sheet is provided with an opening portion having a diameter smaller than an outer diameter of a semiconductor wafer to be stuck, on said opening portion no adhesive layer being formed, and a portion which is provided around the opening portion and on which an adhesive layer is formed.

In the surface protective sheet, it is preferable that the base sheet and the adhesive layer are cut to have almost the same diameter as that of a semiconductor wafer to be stuck, and that the portion on which an adhesive layer is formed are of almost concentric circles.

The method for grinding a semiconductor wafer according to the present invention comprises:

allowing a semiconductor wafer, on a circuit surface of which bumps are formed, to have a surface-protected form wherein an adhesive layer having an opening portion with no adhesive corresponding to a portion of the wafer where the bumps are formed and an adhesive portion corresponding to an outer peripheral portion of the wafer where bumps are not formed is formed and a base sheet is laminated on the adhesive layer so as to cover the opening portion of the adhesive layer, placing the semiconductor wafer of the surface-protected form on a fixing table in such a manner that the base sheet faces the fixing table, and grinding a back surface of the semiconductor wafer.

In the above-mentioned back surface grinding method, the semiconductor wafer of the surface-protected form can be realized by sticking the surface protective sheet of the present invention to the circuit surface of the semiconductor wafer.

Alternatively, the semiconductor wafer of the surface-protected form may be realized by:

sticking the adhesive layer having an opening portion corresponding to a portion of the wafer where bumps are formed and an adhesive portion corresponding to an outer peripheral portion of the wafer where bumps are not formed, to the outer peripheral portion of the semiconductor wafer on a circuit surface of which bumps are formed, and laminating the base sheet on the adhesive layer so as to cover the opening portion of the adhesive layer.

The above-mentioned grinding method can be adapted even to a semiconductor wafer wherein the height of each bump formed on the circuit surface is 50 μm or more and the bump arranged on the outermost side is positioned at a distance of 2 to 10 mm from the outer periphery of the wafer. In the above-mentioned grinding method, a difference (Bt–At) between the height (Bt) of each bump and the thickness (At) of the adhesive layer of the surface protective sheet is preferably in the range of −5 to 50 μm.

According to the surface protective sheet and the method for grinding a semiconductor wafer of the present invention, no adhesive is given to the portion which is to be brought into contact with bumps, so that at the roots of the bumps no adhesive is left, and insufficiency of reliability caused thereby cannot be brought about. Further, because the edge of the wafer can be fixed with the adhesive layer, penetration of cleaning water onto the circuit surface of the wafer is prevented, and fouling of the wafer can be reduced.

DETAILED DESCRIPTION OF THE INVENTION

The present invention is described in detail hereinafter with reference to the drawings.

Figure 1:
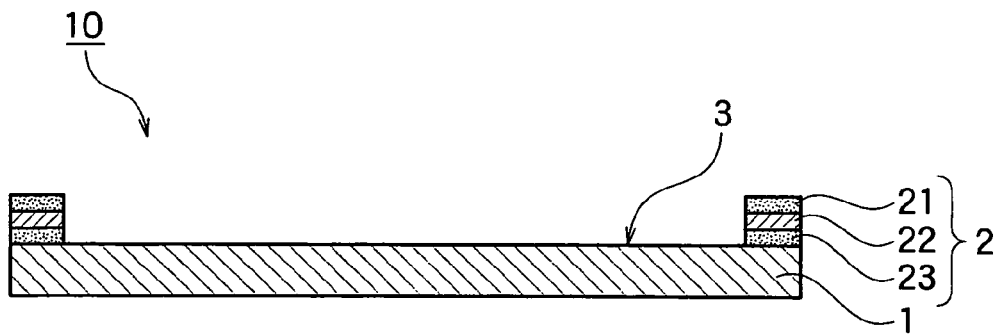
FIG. 1 is a sectional view of a surface protective sheet of the present invention.
Figure 2:
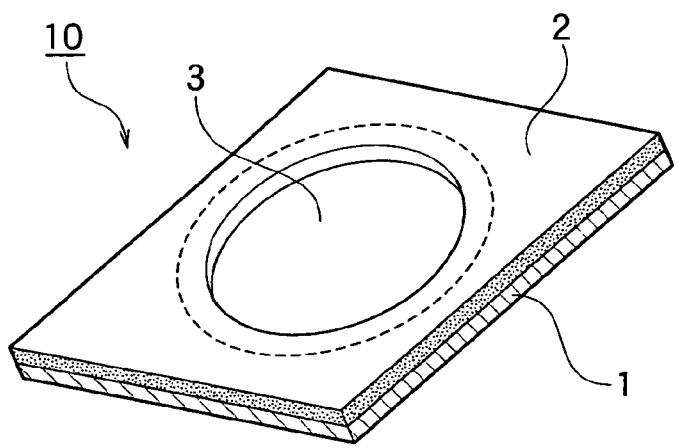
FIG. 2 is a perspective view of a surface protective sheet of the present invention.

As shown in a sectional view of FIG. 1 and a perspective view of FIG. 2, in the surface protective sheet 10 of the present invention, one surface of a base sheet 1 is provided with an opening portion 3 having a diameter smaller than an outer diameter of a semiconductor wafer to be stuck, on said opening portion no adhesive layer being formed, and a portion which is provided around the opening portion and on which an adhesive layer 2 is formed.

Base Sheet 1

As the base sheet 1 used for the surface protective sheet 10 of the invention, any of resin sheets is employable without specific restriction. Examples of the resin sheets include films of polyolefins, such as low-density polyethylene, linear low-density polyethylene, polypropylene and polybutene, films of ethylene copolymers, such as ethylene/vinyl acetate copolymer, ethylene/(meth)acrylic acid copolymer and ethylene/(meth)acrylate copolymer, films of polyesters, such as polyethylene terephthalate and polyethylene naphthalate, and films of other resins, such as polyvinyl chloride, acrylic rubber, polyamide, urethane and polyimide. The base sheet 1 may be a single layer or a laminate made of these resins. The base sheet 1 may be a sheet having been subjected to crosslinking treatment.

As the base sheet 1, a sheet obtained by subjecting a thermoplastic resin to extrusion molding may be used, or a sheet obtained by subjecting a curable resin to thin film forming and curable may be used. The curable resin used herein is, for example, a resin composition obtained by blending an energy ray-curable urethane acrylate oligomer as a main agent, an acrylate monomer having a relatively bulky group as a diluent and if necessary a photopolymerization initiator.

The thickness of the base sheet is in the range of preferably 30 to 1000 μm, more preferably 50 to 500 μm, particularly preferably 100 to 300 μm.

Adhesive Layer 2

The type of an adhesive used for the adhesive layer 2 of the surface protective sheet 10 of the invention is not specifically restricted provided that it has appropriate removability, and the adhesive layer may be formed from general-purpose adhesives, such as rubber type adhesives, acrylic type adhesives, silicone type adhesives, urethane type adhesives and vinyl ether type adhesives. The adhesive may be an energy ray-curable type adhesive which is cured by irradiation with energy rays to exhibit removability.

The adhesive layer 2 may be a single layer of an adhesive, or may be a double side coated adhesive sheet wherein adhesive layers 21 and 23 are provided on both surfaces of a core material film 22, as shown in FIG. 1.

In the case where the adhesive layer is a double side coated adhesive sheet, a film of relatively high rigidity such as a polyethylene terepthalate film is preferably used as the core material film 22 because dimensional stability of the adhesive layer in the production of the surface protective sheet 10 or in the sticking of the sheet 10 to a wafer is excellent. Although the adhesives applied to the both surfaces of the core material film 22 may be the same as each other, it is preferable that the adhesive 23 on the side facing the base sheet 1 is an adhesive having strong adhesion strength and the adhesive 21 on the side facing a wafer is an adhesive exhibiting removability.

A preferred thickness of the adhesive layer 2 is determined by the height of a bump 5 formed on a wafer 4 to be stuck. In the case where the thickness of the adhesive layer is taken as "At" and the height of the bump is taken as "Bt", a difference (Bt–At) between them is in the range of preferably −5 to +50 μm, more preferably ±0 to +40 μm, particularly preferably +10 to +30 μm. When the height (Bt) of the bump 5 is, for example, 100 μm, the thickness of the adhesive layer 2 is in the range of 50 to 105 μm, preferably 60 to 100 μm, particularly preferably 70 to 90 μm. If there is the relationship between the thickness of the adhesive layer and the height of the bump mentioned above, the bump 5 of the wafer and the base sheet 1 come into contact with each other at an appropriate pressure, and therefore, peeling or slipping of the surface protective sheet 10 hardly takes place in the grinding process. Even if the difference (Bt–At) is a negative value namely the thickness of the adhesive layer is larger than the height of the bump to thereby produce a gap, the semiconductor wafer is pressed and deflected in the grinding process to generate an appropriate pressure and this pressure enables fixing of the whole wafer, provided that the value of the difference is small.

Prior to lamination on the base sheet, the adhesive layer 2 is subjected to processing such as punching, and therefore, the adhesive layer is provided in the form of a laminate wherein release films having been treated with a silicone type release agent are laminated on both surfaces, and the release films play a roll of protecting the adhesive layer and a roll of imparting self-supporting ability to the adhesive layer. The release films laminated on both surfaces of the adhesive layer are preferably designed to have a difference in releasability, for example, release films of light-releasable type and heavy-releasable type are preferably provided, whereby workability in the producing of the surface protective sheet is enhanced. In the case where a double sided coated adhesive sheet using different adhesives for the adhesive layers 21 and 23 is used, the release film of light-releasable type can be peeled formerly, and therefore, the adhesive layer on this side faces the base sheet 1 and is laminated thereon, while the adhesive layer on the side of the release film of heavy-releasable type faces the wafer 4 and is stuck to the wafer.

Preparation of Surface Protective Sheet 10

Of the surface protective sheet 10 of the invention, the base sheet surface where an adhesive layer is not formed (referred to as an "opening portion" hereinafter, designated by numeral 3 in the figures) faces a circuit-formed portion where bumps 5 are provided in a wafer 4 to be stuck, and the adhesive layer 2 faces the outer peripheral portion of the wafer where a circuit is not formed.

Prior to lamination on the base sheet 1, the adhesive layer 2 is cut into an almost circle by punching or the like to form an opening portion 3 where an adhesive layer is not formed. In this cutting, it is preferable that the adhesive layer and the release film of light-releasable type are completely punched but the release film of heavy-releasable type is not completely punched, because the release film of heavy-releasable type becomes a carrier of the adhesive layer and the subsequent processing can be continuously carried out by a roll-to-roll method. Then, the remaining release film of light-releasable type is peeled and the adhesive layer is laminated on the base sheet 1 to prepare a surface protective sheet 10.

A surface protective sheet of the above constitution obtained in above step can be used as the surface protective sheet 10 of the invention. In the case where the surface protective sheet of this constitution is used, the opening portion 3 of the surface protective sheet 10 is aligned with the circuit surface of the wafer, and the adhesive layer 2 present around the opening portion is stuck to the outer peripheral portion of the wafer. Then, the surface protective sheet protruded from the wafer is cut away along the outer periphery (indicated by a broken line in FIG. 2) of the wafer 4, and the resulting surface protective sheet is subjected to back surface grinding.

A preferred embodiment of the surface protective sheet of the invention has a constitution such that the outer periphery of the adhesive layer of the surface protective sheet having the above constitution prepared in the previous step is punched almost concentrically with the removed adhesive layer in accordance with the diameter of the wafer to be stuck. Also in this case, it is preferable that only the release film of heavy-releasable type is not punched. That is to say, in the constitution shown in FIG. 2, the base sheet 1 and the adhesive layer 2 are cut and removed in advance in accordance with the outer diameter of the wafer 4. By cutting them into the same shape as that of the wafer in advance, cutting of the surface protective sheet with a cutter can be omitted when the surface protective sheet is stuck to the wafer, and therefore, there is no fear that an edge of the wafer is damaged with a cutter blade to induce breakage of the wafer in the subsequent processing.

Surface-protected Form of Wafer

Figure 3:
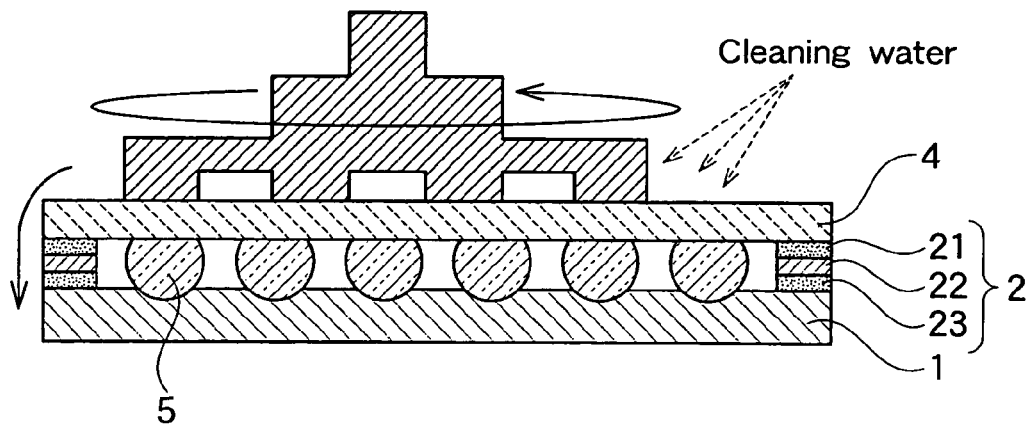
FIG. 3 shows back surface grinding of a wafer wherein a surface protective sheet of the present invention has been stuck to a bump-formed surface of the wafer.
Figure 4:
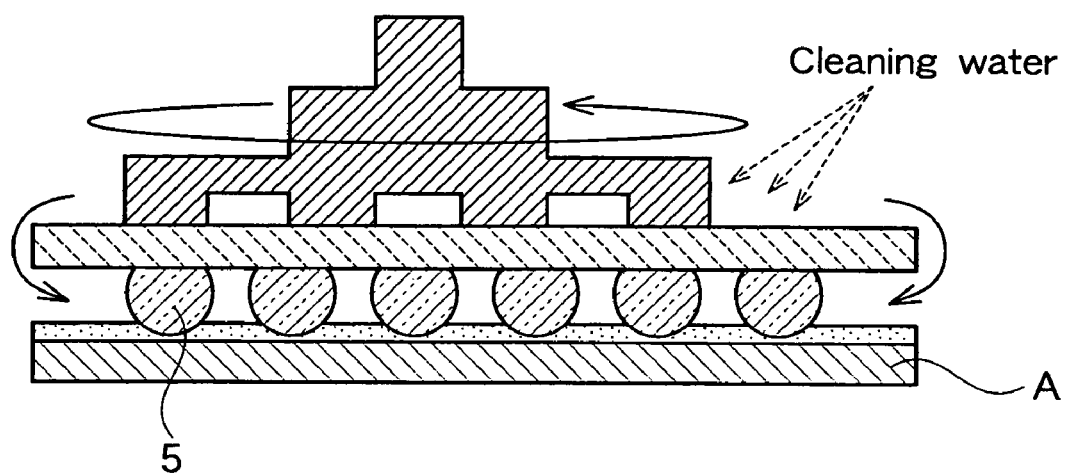
FIG. 4 shows back surface grinding of a wafer wherein a conventional surface protective adhesive sheet "A" has been stuck to a bump-formed surface of the wafer.

The surface protective sheet 10 is stuck to the wafer 4 with accurately aligning the adhesive layer 2 so as not to face the bump 5, as shown in FIG. 3, whereby the semiconductor wafer can be allowed to have a surface-protected form employable for grinding the semiconductor wafer. Sticking of the surface protective sheet 10 is carried out under as low tension as possible so that deformation of the wafer after grinding process attributable to tension should not occur.

In a manner different from that described above, the same surface-protected form may be obtained without preparing the surface protective sheet 10. That is to say, the adhesive layer 2 is stuck to the outer peripheral portion of the semiconductor wafer 4, and subsequently the base sheet 1 is laminated and stuck to the adhesive layer 2 so as to cover the opening portion 3 of the adhesive layer. More specifically, the base sheet 1 and the adhesive layer 2 are separately prepared. From the adhesive layer 2, a portion corresponding to the bump-formed portion on the circuit surface of the semiconductor wafer is punched away to form an opening portion 3. Then, the adhesive layer 2 is accurately stuck so that the opening portion 3 should accord with the circuit region of the semiconductor wafer 4. Subsequently, the base sheet 1 is laminated over the adhesive layer 2 and the opening portion 3 so as to cover the opening portion 3, and finally a laminate of the base sheet 1 and the adhesive layer 2 protruded from the outer periphery of the semiconductor wafer 4 is cut away with a cutter or the like. Thus, the same surface-protected form as that obtained by the use of the surface protective sheet 10 can be obtained.

Back Surface Grinding of Wafer

The wafer used in the method for grinding a semiconductor wafer of the invention may be a wafer of any constitution provided that bumps are formed on the circuit surface. However, a wafer wherein the height of each bump is 50 μm or more, preferably 100 μm or more, and the bump arranged on the outermost side is positioned 2 to 10 mm inside the outer periphery of the wafer is preferably used in the invention, though use of such a wafer is difficult in case of a conventional surface protective adhesive sheet.

The wafer 4 allowed to have the above-mentioned surface-protected form is placed on a wafer fixing table (not shown) of a wafer grinding apparatus in such a manner that the surface protective sheet 10 faces the fixing table, and grinding is carried out in a usual way.

To the outer peripheral region of the wafer 4, the adhesive layer 2 can surely adhere to the periphery of the wafer, so that penetration of cleaning water or the like does not occur in the grinding process, and hence fouling of the circuit surface of the wafer does not occur. Further, the tops of the bumps provided on the wafer circuit surface are in contact with the base sheet at an appropriate pressure, so that peeling or slipping of the surface protective sheet hardly takes place in the grinding process.

EXAMPLE (1) 50 Parts by weight of a urethane acrylate oligomer having a weight-average molecular weight of 5000 (available from Arakawa Chemical Industries, Ltd.), 25 parts by weight of isobornyl acrylate, 25 parts by weight of phenylhydroxypropyl acryalte, 2 parts by weight of a photopolymerization initiator (available from Ciba Specialty Chemicals Inc., Irgacure 184) and 0.2 part by weight of a phthalocyanine pigment were blended to obtain a photo-curable resin composition for cast-forming a base sheet.

The resulting resin composition was applied onto a polyethylene terephthalate (PET) film (available from Toray Industries, Inc., thickness: 38 μm) by a fountain die method in such a manner that the coating thickness became 160 μm. On the coating film, the same PET film was laminated, and then irradiation with ultraviolet rays was carried out using a high-pressure mercury lamp (160 W/cm, height: 10 cm) under the conditions of a light quantity of 250 mJ/cm$^2$ to crosslink and cure the coating film. Thereafter, the PET films on both surfaces were peeled to obtain a base sheet having a thickness of 160 μm.

(2) An acrylic adhesive of strong adhesion type (available from Lintec Corporation, PA-T1) was applied onto one surface of a PET film (available from Toray Industries, Inc.) having a thickness of 50 μm in such a manner that the coating thickness on dry basis became 15 μm, followed by drying.

Then, a release film of light-releasable type (available from Lintec Corporation, trade name: SP-PET3801, thickness: 38 μm) was laminated in such a manner that the release treatment surface faced the adhesive coated surface to obtain a single side coated adhesive sheet.

Subsequently, onto a release treatment surface of a release film of heavy-releasable type (available from Lintec Corporation, trade name: SP-PET3811, thickness: 38 μm), an energy ray-curable type adhesive [a blend of 100 parts by weight of copolymer of n-butyl acrylate/acrylic acid (91/9) having weight-average molecular weight: about 600000, 120 parts by weight of urethane acrylate (molecular weight: about 7000) and 2 parts by weight of a crosslinking agent (isocyanate type)] was applied in such a manner that the coating thickness on dry basis became 15 μm, followed by drying. Then, the resulting film was laminated on the previously prepared single side coated adhesive sheet in such a manner that the energy ray-curable type adhesive coated surface faced an uncoated surface (PET film side) of the single side coated adhesive sheet to prepare a double side coated adhesive sheet as an adhesive layer and the thickness of the adhesive layer was 80 μm.

(3) Punching of the double side coated adhesive sheet prepared in the step (2) was carried out in such a manner that the layers from the release film (light-releasable type) to the energy ray-curable type adhesive layer were punched in the form of a circle having a diameter of 190 mm and that only the release film (heavy-releasable type) was left, and the circular portion was removed. The release film (light-releasable type) of the double side coated adhesive sheet thus punched was peeled, and to the exposed surface of the acrylic adhesive of strong adhesion type, the base sheet prepared in the step (1) was superposed.

Subsequently, punching was carried out in such a manner that the layers from the base sheet to the energy ray-curable type adhesive layer were punched in the form of a circle having a diameter of 200 mm concentrically with the previously punched circular portion and that only the release film (heavy-releasable type) was left, and the outer peripheral portion was removed. Thus, a surface protective sheet of 200 mm diameter wherein an adhesive layer having a width of 5 mm was provided on the base sheet along the outer periphery of the base sheet was prepared.

(4) On a mirror surface of a silicon wafer having a diameter of 200 mm and a thickness of 750 μm, dots (dot height: 100 μm, dot diameter: 100 to 200 μm, dot pitch: 1 mm, position of the outermost dot: 6 mm from the outer periphery of wafer) were printed, and they were regarded as bumps. The release film (heavy-releasable type) was peeled from the surface protective sheet prepared in the step (3), and the surface protective sheet was laminated on the printed surface of the silicon wafer in such a manner that their contours accorded with each other. The bump height was 100 μm and the thickness of the adhesive layer was 80 μm, so that a difference between the bump height and the thickness of the adhesive layer was 20 μm.

The silicon wafer with the surface protective sheet was fixed onto a grinding table of a wafer grinding apparatus in such a manner that the surface protective sheet faced the table, and grinding was carried out so that the finished thickness should become 350 μm.

As a result, the surface protective sheet did not separate from the wafer in the course of grinding, nor did cleaning water penetrate to the circuit surface side of the wafer, nor was the wafer broken, and grinding could be done completely. Further, after the surface protective sheet was irradiated with energy rays (ultraviolet rays) and peeled, the circuit surface was observed. As a result, any foreign substance was not confirmed.

According to the surface protective sheet and the method for grinding a semiconductor wafer of the present invention, any adhesive is not given to the portion which is to be brought into contact with bumps, so that no adhesive is left at the roots of the bumps and insufficiency of reliability caused thereby cannot be brought about. Consequently, it becomes possible to polish even a wafer having bumps of different heights which are highly densely arranged. To the outer peripheral region of the wafer 4, the adhesive layer 2 can surely adhere to the periphery of the wafer, so that penetration of cleaning water does not occur in the grinding process, and hence fouling of a circuit surface does not occur.

The invention claimed is:

1. A surface protective sheet used for grinding a back surface of a semiconductor wafer, wherein:
    one surface of a base sheet is provided with an opening portion having a diameter smaller than an outer diameter of a semiconductor wafer to be stuck, on said opening portion no adhesive layer being formed, and a portion which is provided around the opening portion and on which an adhesive layer is formed, wherein:
    the adhesive layer is a double side coated adhesive sheet wherein adhesive layers are provided on both surfaces of a core material film, wherein:
    one adhesive layer on the side facing the base sheet is an adhesive having strong adhesion strength and other adhesive layer on the side facing the wafer is an energy ray-curable adhesive which is cured by irradiation with energy rays to exhibit removability.

2. The surface protective sheet as claimed in claim 1, wherein the base sheet and the adhesive layer are cut to have almost the same diameter as that of a semiconductor wafer to be stuck, and the portion on which an adhesive layer is formed are of almost concentric circles.

3. The surface protective sheet as claimed in claim 1, wherein the core material film is polyethyleneterephthalate film.

4. A method for grinding a semiconductor wafer comprising:
    allowing a semiconductor wafer, on a circuit surface of which bumps are formed, to be in a surface-protected form wherein an adhesive layer having an opening portion with no adhesive corresponding to a portion of the wafer where the bumps are formed and an adhesive portion corresponding to an outer peripheral portion of the wafer where bumps are not formed is formed and a base sheet is laminated on the adhesive layer so as to cover the opening portion of the adhesive layer,
    placing the semiconductor wafer of the surface-protected form on a fixing table in such a manner that the base sheet faces the fixing table, and
    grinding a back surface of the semiconductor wafer, wherein:
    the adhesive layer is a double side coated adhesive sheet wherein adhesive layers are provided on both surfaces of a core material film, and wherein:
    one adhesive layer on the side facing the base sheet is an adhesive having strong adhesion strength and other adhesive layer on the side facing the wafer is an energy ray-curable adhesive which is cured by irradiation with energy rays to exhibit removability.

5. The method for grinding a semiconductor wafer as claimed in claim 4, wherein the core material film is polyethyleneterephthalate film.

6. A method for grinding a semiconductor wafer comprising:
allowing a semiconductor wafer, on a circuit surface of which bumps are formed, to be in a surface-protected form wherein an adhesive layer having an opening portion with no adhesive corresponding to a portion of the wafer where the bumps are formed and an adhesive portion corresponding to an outer peripheral portion of the wafer where bumps are not formed is formed and a base sheet is laminated on the adhesive layer so as to cover the opening portion of the adhesive layer, placing the semiconductor wafer of the surface-protected form on a fixing table in such a manner that the base sheet faces the fixing table, and grinding a back surface of the semiconductor wafer, wherein:

the semiconductor wafer is allowed to have the surface-protected form by:

supplying the adhesive layer in such manner that both surfaces of the adhesive layer are laminated with release films of light-releasable type and heavy-releasable type, wherein the adhesive layer and the release film of light-releasable type are punched to form the opening portion, so that the adhesive layer is supported on the release film of heavy-releasable type, peeling the release film of light-releasable type while adhering the exposed surface of the adhesive layer to the base sheet, and peeling the release film of heavy-releasable type while adhering the exposed surface of the adhesive layer to the outer peripheral portion of the wafer.

7. The method for grinding a semiconductor wafer as claimed in claim 6, wherein the height of each bump formed on the circuit surface is 50 μm or more and the bump arranged on the outermost side is positioned at a distance of 2 to 10 mm from the outer periphery of the wafer.

8. The method for grinding a semiconductor wafer as claimed in claim 6, wherein a difference (Bt–At) between the height (Bt) of each bump and the thickness (At) of the adhesive layer is in the range of −5 to 50 μm.

9. A method for grinding a semiconductor wafer comprising:
allowing a semiconductor wafer, on a circuit surface of which bumps are formed, to be in a surface-protected form wherein an adhesive layer having an opening portion with no adhesive corresponding to a portion of the wafer where the bumps are formed and an adhesive portion corresponding to an outer peripheral portion of the wafer where bumps are not formed is formed and a base sheet is laminated on the adhesive layer so as to cover the opening portion of the adhesive layer, placing the semiconductor wafer of the surface-protected form on a fixing table in such a manner that the base sheet faces the fixing table, and grinding a back surface of the semiconductor wafer, wherein:

the semiconductor wafer is allowed to have the surface-protected form by:

sticking the adhesive layer having an opening portion corresponding to a portion of the wafer where bumps are formed and an adhesive portion corresponding to an outer peripheral portion of the wafer where bumps are not formed, to the outer peripheral portion of the semiconductor wafer on a circuit surface of which bumps are formed, and laminating the base sheet on the adhesive layer so as to cover the opening portion of the adhesive layer, and supplying the adhesive layer in such manner that both surfaces of the adhesive layer are laminated with release films of light-releasable type and heavy-releasable type, wherein the adhesive layer and the release film of light-releasable type are punched to form the opening portion, so that the adhesive layer is supported on the release film of heavy releasable type.

* * * * *